United States Patent
Nishide et al.

(10) Patent No.: US 11,244,804 B2
(45) Date of Patent: Feb. 8, 2022

(54) ETCHING METHOD, PLASMA PROCESSING APPARATUS, AND PROCESSING SYSTEM

(71) Applicant: TOKYO ELECTRON LIMITED, Tokyo (JP)

(72) Inventors: Daisuke Nishide, Miyagi (JP); Toru Hisamatsu, Miyagi (JP); Shinya Ishikawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/775,960

(22) Filed: Jan. 29, 2020

(65) Prior Publication Data
US 2020/0243298 A1 Jul. 30, 2020

(30) Foreign Application Priority Data

Jan. 30, 2019 (JP) .............................. JP2019-014084

(51) Int. Cl.
| | |
|---|---|
| H01J 37/18 | (2006.01) |
| C23C 16/505 | (2006.01) |
| H01J 37/32 | (2006.01) |
| H01L 21/306 | (2006.01) |
| H01L 21/3065 | (2006.01) |
| H01L 21/308 | (2006.01) |
| H01L 21/3213 | (2006.01) |
| H01L 21/311 | (2006.01) |

(52) U.S. Cl.
CPC .......... H01J 37/185 (2013.01); C23C 16/505 (2013.01); H01J 37/32082 (2013.01); H01J 37/32899 (2013.01); H01L 21/306 (2013.01); H01L 21/308 (2013.01); H01L 21/3065 (2013.01); H01L 21/31127 (2013.01); H01L 21/32135 (2013.01); H01L 21/32136 (2013.01); H01L 21/32137 (2013.01); H01J 2237/334 (2013.01); H01J 2237/3321 (2013.01)

(58) Field of Classification Search
None
See application file for complete search history.

(56) References Cited

U.S. PATENT DOCUMENTS

| | | | |
|---|---|---|---|
| 8,476,168 B2 * | 7/2013 | Graves-Abe | ...... H01L 21/76898 438/700 |
| 9,543,158 B2 * | 1/2017 | Hudson | ............. H01L 21/30655 |
| 2007/0026677 A1 * | 2/2007 | Ji | ........................ H01L 21/0337 438/689 |

FOREIGN PATENT DOCUMENTS

JP 2016-076621 A 5/2016

* cited by examiner

Primary Examiner — Stephanie P Duclair
(74) Attorney, Agent, or Firm — Weihrouch IP

(57) ABSTRACT

An etching method includes: providing a substrate having a film and a patterned mask on the film; forming a silicon-containing layer including silicon, carbon, and nitrogen on the substrate using a precursor gas containing silicon; and performing a plasma etching on the film. The substrate is placed under a depressurized environment for a time period from a start time point of the step of forming the silicon-containing layer on the substrate to an end time point of the step of performing the plasma etching on the film.

20 Claims, 9 Drawing Sheets

ETCHING METHOD, PLASMA PROCESSING APPARATUS, AND PROCESSING SYSTEM

CROSS-REFERENCE TO RELATED APPLICATIONS

This application is based on and claims priority from Japanese Patent Application No. 2019-014084, filed on Jan. 30, 2019, the disclosures of which are incorporated herein in their entirety by reference, and priority is claimed to each of the foregoing.

TECHNICAL FIELD

The present disclosure relates to an etching method, a plasma processing apparatus, and a processing system.

BACKGROUND

In manufacturing electronic devices, a plasma etching is performed, for example, to transfer a pattern of a mask onto a film of a substrate. A silicon oxide layer may be formed on the substrate before the plasma etching is performed, in order to reduce the width of an opening of the mask. The film of the substrate is selectively etched with respect to the silicon oxide layer by the plasma etching. This technology is disclosed in, for example, Japanese Patent Laid-Open Publication No. 2016-076621.

SUMMARY

An embodiment of the present disclosure provides a method of etching a film. The etching method includes a step of forming a silicon-containing layer on a substrate. The substrate has a film and a mask. The mask is formed on the film and patterned. The silicon-containing layer is formed by a plasma processing using a precursor gas containing silicon. The silicon-containing layer includes silicon, carbon, and nitrogen. The material of the silicon-containing layer is different from the material of the film. The etching method further includes a step of performing a plasma etching on the film. The substrate is placed under a depressurized environment for a time period from a start time point of the step of forming the silicon-containing layer on the substrate to an end time point of the step of performing the plasma etching on the film.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
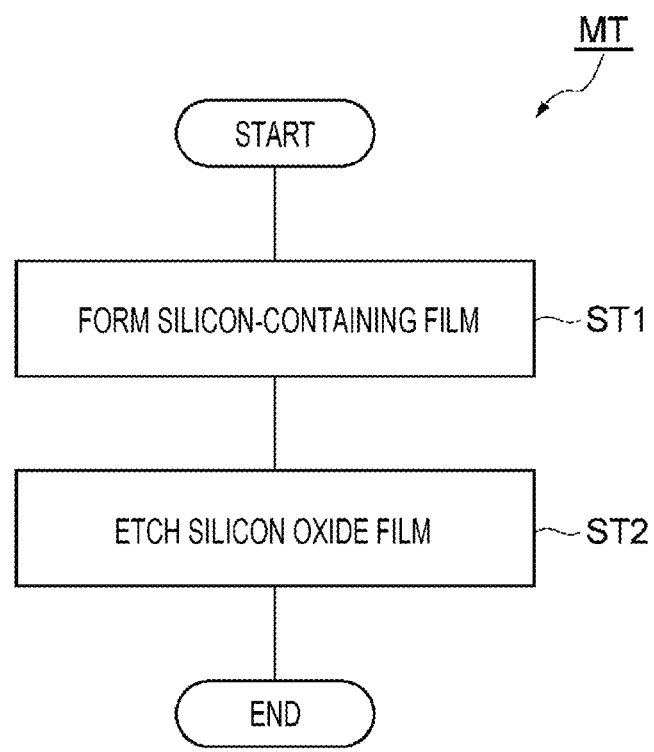
FIG. 1 is a flowchart of an etching method according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, various embodiments will be described.

An embodiment of the present disclosure provides a method of etching a film. The etching method includes a step of forming a silicon-containing layer on a substrate. The substrate has a film and a mask. The mask is formed on the film and patterned. The silicon-containing layer is formed by a plasma processing using a precursor gas containing silicon. The silicon-containing layer includes silicon, carbon, and nitrogen. The material of the silicon-containing layer is different from the material of the film. The etching method further includes a step of performing a plasma etching of the film. The substrate is placed under a depressurized environment for a time period from a start time point of the step of forming the silicon-containing layer on the substrate to an end time point of the step of performing the plasma etching on the film.

In the etching method of the embodiment described above, the silicon-containing layer formed on the mask includes silicon, carbon, and nitrogen. Accordingly, it becomes possible to etch the film in a state where a layer different from the silicon oxide layer is formed on the mask.

In an embodiment, the precursor gas may be an aminosilane-based gas.

In an embodiment, the step of forming the silicon-containing layer may include a plasma processing using a mixed gas including a precursor gas and a diluent gas that dilutes the precursor gas.

In an embodiment, the step of forming the silicon-containing layer includes repeating a sequence. The sequence includes supplying the diluent gas to the substrate in a first time period, a second time period subsequent to the first time period, and a third time period subsequent to the second time period. The sequence includes supplying the precursor gas to the substrate in the first time period and the second time period. The sequence includes supplying a radio-frequency power in the second time period and the third time period, in order to form plasma from the precursor gas and the diluent gas in the second time period and generate plasma from the diluent gas in the third time period.

In an embodiment, the step of forming the silicon-containing layer and the step of performing the plasma etching on the film may be performed using a single plasma processing apparatus. The substrate may be placed in a chamber of the single plasma processing apparatus for a time period from a start time point of the step of forming the silicon-containing layer to an end time point of the step of performing the plasma etching on the film.

In an embodiment, a first plasma processing apparatus that is used in the step of forming the silicon-containing layer may be connected to a second plasma processing apparatus that is used in the step of performing the plasma etching on the film, via a vacuum transfer system. The substrate is placed in the chamber of the first plasma processing apparatus during the step of forming the silicon-containing layer. After the step of forming the silicon-containing layer is performed and before the step of performing the plasma etching on the film is performed, the substrate is transferred from the first plasma processing apparatus to the second plasma processing apparatus only through the vacuum transfer system. The substrate is placed in the chamber of the second plasma processing apparatus during the step of performing the plasma etching on the film.

In an embodiment, in the step of forming the silicon-containing layer, the temperature of the substrate may be set to 150° C. or lower. According to this embodiment, it becomes possible to reduce a difference between the temperature of the substrate when the silicon-containing layer is formed and the temperature of the substrate when the film is etched.

In an embodiment, the silicon-containing layer may not have silicon-oxygen bonds in the skeleton thereof. In an embodiment, the film may be a silicon oxide film. Since the silicon-containing layer is formed without being exposed to the atmosphere, the silicon-containing layer is suppressed from being oxidized. When the film is a silicon oxide film, the silicon-containing layer is suppressed from being etched during the plasma etching of the film.

Another embodiment of the present disclosure provides a plasma processing apparatus that is used for etching a film. The plasma processing apparatus includes a chamber, a gas supply, a radio-frequency power supply, and a controller. The gas supply is connected to the chamber. The radio-frequency power supply is configured to supply a radio-frequency power in order to form plasma from a gas in the chamber. The controller is configured to control the gas supply and the radio-frequency power supply. The controller controls the gas supply to supply a precursor gas containing silicon into the chamber, and controls the radio-frequency power supply to supply a radio-frequency power, in order to form the silicon-containing layer on the substrate. The substrate has a film and a mask. The mask is formed on the film and patterned. The silicon-containing layer includes silicon, carbon, and nitrogen, and is formed of a material different from the material of the film. The controller controls the gas supply to supply a processing gas into the chamber, and controls the radio-frequency power supply to supply a radio-frequency power, in order to perform the plasma etching on the film.

Yet another embodiment of the present disclosure provides a processing system that is used for etching a film. The processing system includes a first plasma processing apparatus, a second plasma processing apparatus, a vacuum transfer system, and a controller. The vacuum transfer system is configured to transfer a substrate between the first plasma processing apparatus and the second plasma processing apparatus. The controller is configured to control the first plasma processing apparatus, the second plasma processing apparatus, and the vacuum transfer system. Each of the first plasma processing apparatus and the second plasma processing apparatus includes a chamber, a gas supply, and a radio-frequency power supply. The gas supply is connected to the chamber. The radio-frequency power supply is configured to supply a radio-frequency power in order to form plasma from a gas in the chamber. The controller controls the gas supply of the first plasma processing apparatus to supply a precursor gas containing silicon into the chamber of the first plasma processing apparatus, and controls the radio-frequency power supply of the first plasma processing apparatus to supply a radio-frequency power, in order to form the silicon-containing layer on the substrate. The substrate has a film and a mask. The mask is formed on the film and patterned. The silicon-containing layer includes silicon, carbon, and nitrogen, and is formed of a material different from the material of the film. The controller controls the gas supply of the second plasma processing apparatus to supply a processing gas into the chamber of the second plasma processing apparatus, and controls the radio-frequency power supply of the second plasma processing apparatus to supply a radio-frequency power, in order to perform the plasma etching on the film.

Hereinafter, various embodiments will be described in detail with reference to the drawings. Meanwhile, in the respective drawings, similar or corresponding portions will be denoted by the same reference numerals.

FIG. 1 is a flowchart of an etching method according to an embodiment. The etching method illustrated in FIG. 1 (hereinafter, referred to as a "method MT") is performed for etching a film of a substrate. The film of the substrate which is etched in the method MT is formed of a material different from a material of a silicon-containing layer to be described later. The film of the substrate which is etched in the method MT may be formed of any material as long as the film may be selectively etched with respect to the silicon-containing layer. The film of the substrate which is etched in the method MT is, for example, a silicon oxide film, a polysilicon film, a silicon nitride film, or a carbon film.

Figure 2A:
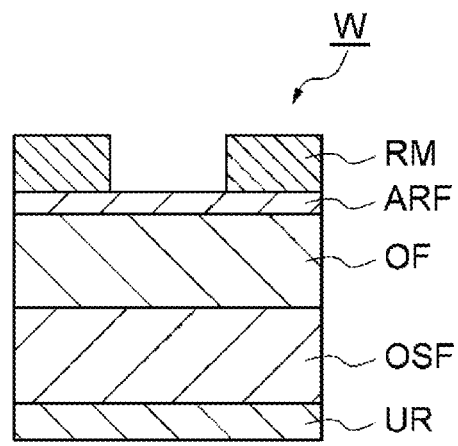
FIG. 2A is a partial enlarged cross-sectional view of an example of a substrate in a state before a mask is formed.
Figure 2B:
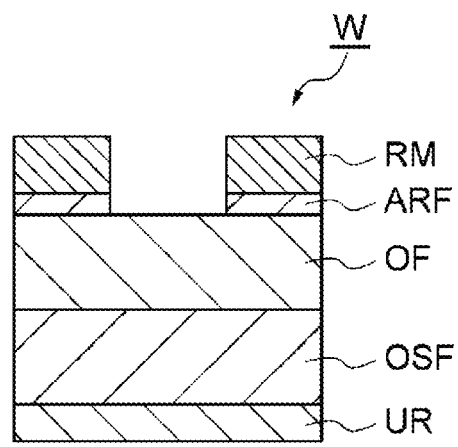
FIG. 2B is a partial enlarged cross-sectional view of an example of a substrate in another state before a mask is formed.
Figure 2C:
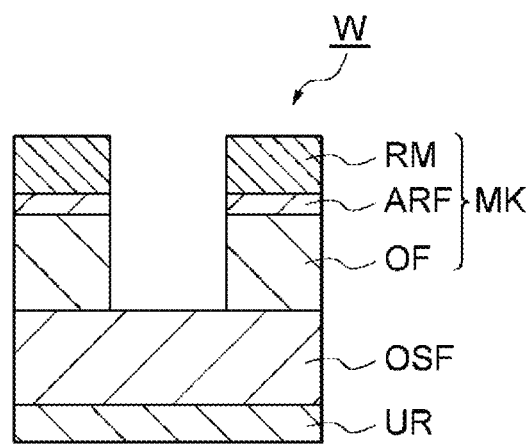
FIG. 2C is a partial enlarged cross-sectional view of an example of a substrate.

FIG. 2C is a partial enlarged cross-sectional view of an example of the substrate. A substrate W illustrated in FIG. 2C includes a silicon oxide film OSF and a mask MK. The substrate W may further include an underlying region UR. The silicon oxide film OSF is an example of the film which is etched in the method MT. The silicon oxide film OSF is formed on the underlying region UR. The mask MK is formed on the silicon oxide film OSF. The mask MK is patterned. That is, the mask MK provides one or more openings. In the one or more openings of the mask MK, the silicon oxide film OSF is exposed. The mask MK may be formed of any one or more materials as long as the materials are different from the material of the silicon oxide film. In addition, the mask MK may be formed by a single film or a multilayer film.

Figure 3:
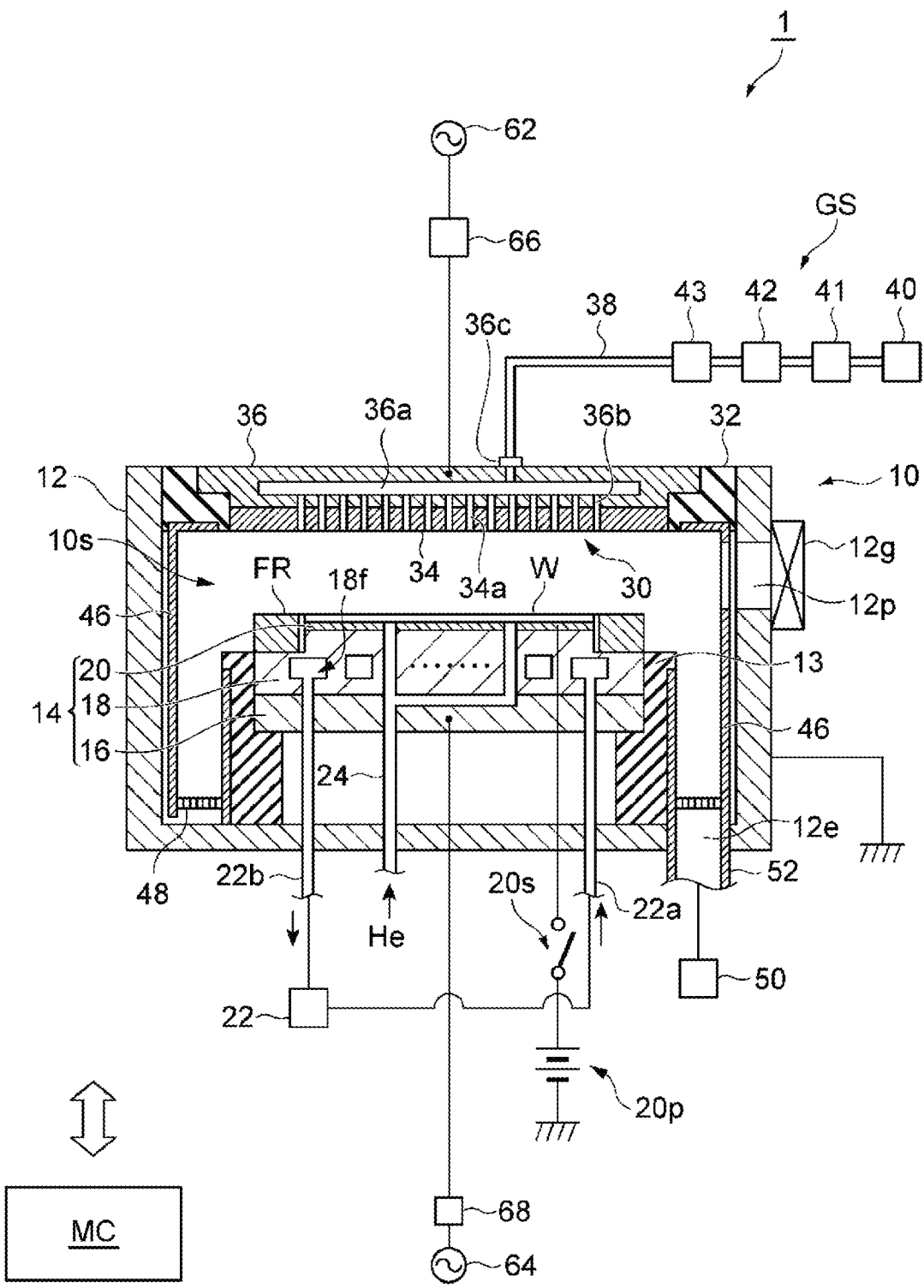
FIG. 3 is a view schematically illustrating an example of a plasma processing apparatus which is usable for performing the etching method illustrated in FIG. 1.

In an embodiment, the method MT is performed using a single plasma processing apparatus. FIG. 3 is a view schematically illustrating an example of a plasma processing apparatus that is usable for performing the etching method illustrated in FIG. 1. A plasma processing apparatus 1 illustrated in FIG. 3 is a capacitively coupled plasma processing apparatus. The plasma processing apparatus 1 includes a chamber 10. The chamber 10 provides an internal space 10s therein.

That chamber 10 includes a chamber body 12. The chamber body 12 has a substantially cylindrical shape. The internal space 10s is provided inside the chamber body 12. The chamber body 12 is formed of a conductor such as aluminum. The chamber body 12 is grounded. A film having a corrosion resistance property is coated on the inner wall surface of the chamber body 12. The film having the corrosion resistance property may be formed of ceramic such as aluminum oxide or yttrium oxide.

A passage 12p is formed in the side wall of the chamber body 12. The substrate W passes through the passage 12p when being transferred between the internal space 10s and the outside of the chamber 10. The passage 12p is openable/closable by a gate valve 12g. The gate valve 12g is provided along the side wall of the chamber body 12.

A support 13 is provided on the bottom of the chamber body 12. The support 13 is formed of an insulating material. The support 13 has a substantially cylindrical shape. The support 13 extends upward from the bottom of the chamber body 12 inside the inner space 10s. The support 13 supports a substrate supporter 14. The substrate supporter 14 is configured to support the substrate W inside the chamber 10, that is, in the inner space 10s.

The substrate supporter 14 includes a lower electrode 18 and an electrostatic chuck 20. The lower electrode 18 and the electrostatic chuck 20 are provided in the chamber 10. The substrate supporter 14 may further include an electrode plate 16. The electrode plate 16 is formed of a conductor such as aluminum, and has a substantially disk shape. The lower electrode 18 is provided on the electrode plate 16. The lower electrode 18 is formed of, for example, a conductor such as aluminum, and has a substantially disk shape. The lower electrode 18 is electrically connected to the electrode plate 16.

The electrostatic chuck 20 is provided on the lower electrode 18. The substrate W is placed on the upper surface of the electrostatic chuck 20. The electrostatic chuck 20 includes a main body and an electrode. The main body of the electrostatic chuck 20 is formed of a dielectric. The electrode of the electrostatic chuck 20 is a film-shaped electrode and is provided in the main body of the electrostatic chuck 20. The electrode of the electrostatic chuck 20 is connected to a DC power supply 20p via a switch 20s. When a voltage from the DC power supply 20p is applied to the electrode of the electrostatic chuck 20, an electrostatic attractive force is generated between the electrostatic chuck 20 and the substrate W. The substrate W is attracted to and held by the electrostatic chuck 20 by the generated electrostatic attractive force.

An edge ring FR is disposed on the substrate supporter 14. Without being limited, the edge ring FR may be formed of silicon, silicon carbide, or quartz. When the processing of the substrate W is performed in the chamber 10, the substrate W is placed on the electrostatic chuck 20 and in the region surrounded by the edge ring FR.

A flow path 18f is formed inside the lower electrode 18. A heat exchange medium (e.g., coolant) is supplied to the flow path 18f from a chiller unit 22 via a pipe 22a. The chiller unit 22 is provided outside the chamber 10. The heat exchange medium supplied to the flow path 18f is returned to the chiller unit 22 through a pipe 22b. In the plasma processing apparatus 1, the temperature of the substrate W placed on the electrostatic chuck 20 is adjusted by a heat exchange between the heat exchange medium and the lower electrode 18.

The plasma processing apparatus 1 may further include a gas supply line 24. The gas supply line 24 supplies a heat transfer gas (e.g., He gas) to the space between the upper surface of the electrostatic chuck 20 and the rear surface of the substrate W. The heat transfer gas is supplied from a heat transfer gas supply mechanism to the gas supply line 24.

The plasma processing apparatus 1 further includes an upper electrode 30. The upper electrode 30 is provided above the substrate supporter 14. The upper electrode 30 is supported in the upper portion of the chamber body 12 via a member 32. The member 32 is formed of a material having an insulating property. The upper electrode 30 and the member 32 close the upper opening of the chamber body 12.

The upper electrode 30 may include a top plate 34 and a support 36. The lower surface of the top plate 34 is close to the internal space 10s, and defines the internal space 10s. The top plate 34 is formed of a silicon-containing material. The top plate 34 is formed of, for example, silicon or silicon carbide. A plurality of gas discharge holes 34a is formed in the top plate 34. The plurality of gas discharge holes 34a penetrates the top plate 34 in the thickness direction of the top plate 34.

The support 36 detachably supports the top plate 34. The support 36 may be formed of a conductive material such as aluminum. A gas diffusion chamber 36a is formed inside the support 36. A plurality of gas discharge holes 36b is formed in the support 36. The plurality of gas holes 36b extends downward from the gas diffusion chamber 36a. The plurality of gas holes 36b communicates with the plurality of gas discharge holes 34a, respectively. A gas inlet port 36c is formed in the support 36. The gas inlet port 36c is connected to the gas diffusion chamber 36a. A gas supply pipe 38 is connected to the gas inlet port 36c.

A gas source group 40 is connected to the gas supply pipe 38 via a valve group 41, a flow rate controller group 42, and a valve group 43. The gas source group 40, the valve group 41, the flow rate controller group 42, and the valve group 43 constitute a gas supply GS. The gas source group 40 includes a plurality of gas sources. The plurality of gas sources in the gas source group 40 includes a plurality of gas sources that is used in the method MT. Each of the valve group 41 and the valve group 43 includes a plurality of opening/closing valves. The flow rate controller group 42 includes a plurality of flow rate controllers. Each of the plurality of flow controllers in the flow controller group 42 is a mass flow controller or a pressure control type flow controller. Each of the plurality of gas sources in the gas source group 40 is connected to the gas supply pipe 38 via a corresponding opening/closing valve of the valve group 41, a corresponding flow rate controller of the flow rate controller group 42, and a corresponding opening/closing valve of the valve group 43.

In the plasma processing apparatus 1, a shield 46 is detachably provided along the inner wall of the chamber body 12. The shield 46 is also provided on the outer periphery of the support 13. The shield 46 suppresses byproducts of a plasma processing from being attached to the chamber body 12. The shield 46 is configured by forming a film having a corrosion resistance property on the surface of a member formed of, for example, aluminum. The film having a corrosion resistance property may be formed of ceramic such as yttrium oxide.

A baffle plate 48 is provided between the support 13 and the side wall of the chamber body 12. The baffle plate 48 is configured by forming a film having a corrosion resistance property on the surface of a member formed of, for example, aluminum. The film having a corrosion resistance property may be formed of ceramic such as yttrium oxide. In the baffle plate 48, a plurality of through holes is formed. An exhaust port 12e is formed below the baffle plate 48 and in the bottom of the chamber body 12. An exhaust device 50 is connected to the exhaust port 12e via an exhaust pipe 52. The exhaust device 50 includes a pressure regulating valve and a vacuum pump such as a turbo molecular pump.

The plasma processing apparatus 1 further includes a first radio-frequency power supply 62 and a second radio-frequency power supply 64. The first radio-frequency power supply 62 generates a first radio-frequency power. In an example, the first radio-frequency power has a frequency suitable for generating plasma. The frequency of the first radio-frequency power falls within a range of, for example, 27 MHz to 100 MHz. In an example, the frequency of the first radio-frequency power may be 60 MHz. The first radio-frequency power supply 62 is connected to the upper electrode 30 via a matching unit 66 and the electrode plate 16. The matching unit 66 has a circuit for matching an output impedance of the first radio-frequency power supply 62 and an impedance of a load side (the upper electrode 30 side) with each other. Meanwhile, the first radio-frequency power supply 62 may be connected to the lower electrode 18 via the matching unit 66.

The second radio-frequency power supply 64 generates a second radio-frequency power. The second radio-frequency power has a frequency lower than the frequency of the first radio-frequency power. The second radio-frequency power may be used as a bias radio-frequency power for drawing ions into the substrate W. The frequency of the second radio-frequency power falls within a range of, for example, 400 kHz to 40 MHz. In an example, the frequency of the second radio-frequency power may be 40 MHz. The second radio-frequency power supply 64 is connected to the lower electrode 18 via a matching unit 68 and the electrode plate 16. The matching unit 68 has a circuit for matching an output impedance of the second radio-frequency power supply 64 and an impedance of a load side (the lower electrode 18 side) with each other. Meanwhile, the plasma processing apparatus 1 may include only one of the first radio-frequency power supply 62 and the second radio-frequency power supply 64.

The plasma processing apparatus 1 further includes a controller MC. The controller MC may be a computer including a processor, a storage unit such as a memory, an input device, a display device, a signal input/output interface and others. The controller MC controls each unit of the plasma processing apparatus 1. In the controller MC, an operator may perform a command input operation or the like using the input device in order to manage the plasma processing apparatus 1. Further, in the controller MC, the display device may visualize and display the operating status of the plasma processing apparatus 1. Further, the storage unit of the controller MC stores a control program and recipe data. The processor of the controller MC executes the control program to perform various types of processing in the plasma processing apparatus 1. When the processor of the controller MC executes the control program so as to control each unit of the plasma processing apparatus 1 according to recipe data, the method MT is performed in the plasma processing apparatus 1.

Figure 4A:
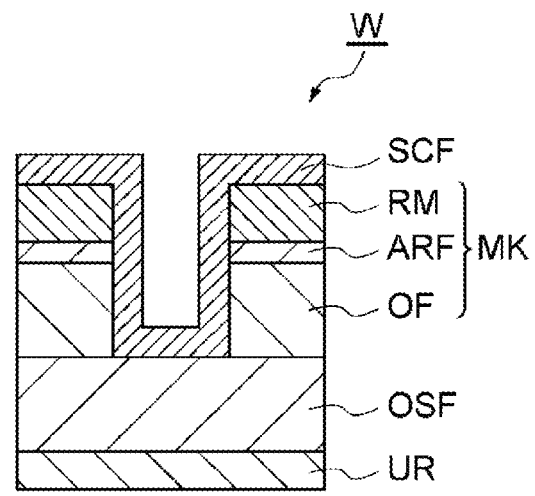
FIG. 4A is a partial enlarged cross-sectional view of an example of a substrate in a state after step ST1 of a method MT is performed.
Figure 4B:
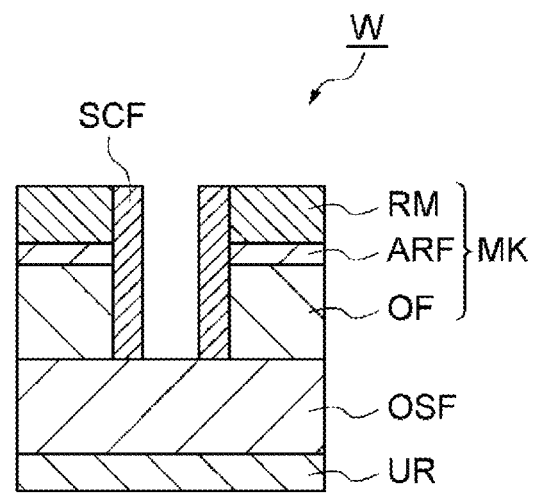
FIG. 4B is a partial enlarged cross-sectional view of an example of a substrate in a state after an etching-back of a silicon-containing layer is performed.
Figure 5A:
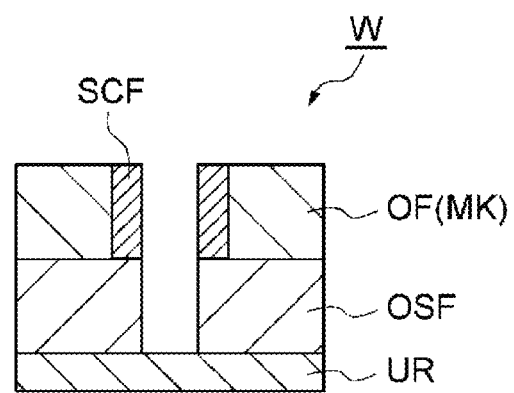
FIG. 5A is a partial enlarged cross-sectional view of an example of a substrate in a state after step ST2 of the method MT is performed.
Figure 5B:
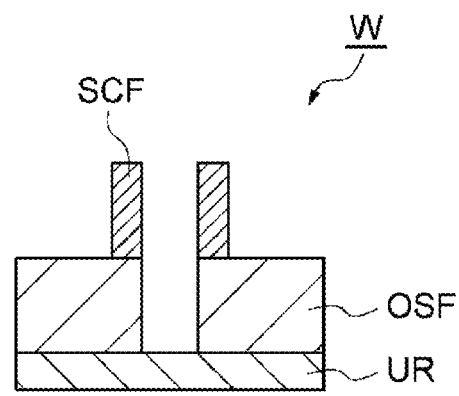
FIG. 5B is a partial enlarged cross-sectional view of an example of a substrate in a state after a mask is removed.

Referring back to FIG. 1, the method MT will be described in detail. In the descriptions hereinbelow, the method MT will be described assuming, for example, a case where the method MT is applied to the substrate W using the plasma processing apparatus 1. Meanwhile, the method MT may be applied to a substrate different from the illustrated substrate W. Further, in the descriptions hereinbelow, a control of each unit of the plasma processing apparatus 1 by the controller MC will also be described in detail. Further, in the descriptions hereinbelow, FIGS. 2A to 2C, 4A and 4B, and 5A and 5B will be referred to, in addition to FIG. 1. FIG. 2A is a partial enlarged cross-sectional view of an example of the substrate in a state before the mask is formed, FIG. 2B is a partial enlarged cross-sectional view of an example of the substrate in another state before the mask is formed, and FIG. 2C is a partial enlarged cross-sectional view of an example of the substrate. FIG. 4A is a partial enlarged cross-sectional view of an example of the substrate in a state after step ST1 of the method MT is performed, and FIG. 4B is a partial enlarged cross-sectional view of an example of the substrate in a state after an etching back of the silicon-containing layer is performed. FIG. 5A is a partial enlarged cross-sectional view of an example of the substrate in a state after step ST2 of the method MT is performed, and FIG. 5B is a partial enlarged cross-sectional view of an example of the substrate in a state after the mask is removed.

As illustrated in FIG. 1, the method MT includes steps ST1 and ST2. As illustrated in FIG. 2A, the substrate W may further include an organic film OF, an antireflection film ARF, and a resist mask RM in a state before step ST1 is performed. The organic film OF is formed on the silicon oxide film OSF. The antireflection film ARF is formed on the organic film OF. The antireflection film ARF may contain silicon. The resist mask RM is formed on the antireflection film ARF. The resist mask RM is patterned. That is, the resist mask RM provides one or more openings. The resist mask RM is patterned using, for example, a lithography technique.

The method MT may further include a step of forming the mask MK. The step of forming the mask MK is performed before step ST1 is performed. In the step of forming the mask MK, a plasma etching of the antireflection film ARF is performed in order to form the mask MK from the substrate W illustrated in FIG. 2A. The substrate W is held by the electrostatic chuck 20 during the performance of the plasma etching of the antireflection film ARF. In the plasma etching of the antireflection film ARF, plasma is generated from a processing gas (e.g., an etching gas) in the chamber 10. The processing gas may include fluorocarbon gas such as $CF_4$ gas. The antireflection film ARF is etched by chemical species supplied from the plasma. As a result of the plasma etching of the antireflection film ARF, the pattern of the resist mask RM is transferred to the antireflection film ARF as illustrated in FIG. 2B.

For the plasma etching of the antireflection film ARF, the controller MC controls the gas supply GS to supply the processing gas into the chamber 10. For the plasma etching of the antireflection film ARF, the controller MC controls the exhaust device 50 to control the pressure in the chamber 10 to a specified pressure. For the plasma etching of the antireflection film ARF, the controller MC controls the first radio-frequency power supply 62 and/or the second radio-frequency power supply 64 to supply the first radio-frequency power and/or the second radio-frequency power.

In the step of forming the mask MK, a plasma etching of the organic film OF is subsequently performed in order to form the mask MK from the substrate W illustrated in FIG. 2B. The substrate W is held by the electrostatic chuck 20 during the performance of the plasma etching of the organic film OF. In the plasma etching of the organic film OF, plasma is generated from the processing gas in the chamber 10. The processing gas is, for example, a mixed gas of hydrogen gas and nitrogen gas. The processing gas may be an oxygen-containing gas. The organic film OF is etched by chemical species supplied from the plasma. As a result of the plasma etching of the organic film OF, the pattern of the antireflection film ARF is transferred to the organic film OF as illustrated in FIG. 2C. As a result, the mask MK is formed. In this example, the mask MK includes the resist mask RM, the antireflection mask ARF, and the organic film OF.

For the plasma etching of the organic film OF, the controller MC controls the gas supply GS to supply the processing gas into the chamber 10. For the plasma etching of the organic film OF, the controller MC controls the exhaust device 50 to control the pressure in the chamber 10 to a specified pressure. For the plasma etching of the organic film OF, the controller MC controls the first radio-frequency power supply 62 and/or the second radio-frequency power supply 64 to supply the first radio-frequency power and/or the second radio-frequency power.

In the method MT, step ST1 is performed in order to form a silicon-containing layer SCF on the substrate W having the mask MK as illustrated in FIG. 4A. The silicon-containing layer SCF is formed by a plasma processing using a precursor gas containing silicon. The silicon-containing layer SCF includes silicon, carbon, and nitrogen. The silicon-containing layer SCF is formed of a material different from the material of the film to be etched in step ST2 (the silicon oxide film OSF in an example). In an embodiment, the silicon-containing layer SCF may not substantially have silicon-oxygen bonds in the skeleton thereof. The silicon-containing layer SCF may be a silicon carbonitride film (SiCN film). In an embodiment, the precursor gas includes an aminosilane-based gas. In an embodiment, the silicon-containing layer SCF may be formed by a plasma processing using a mixed gas of a precursor gas and a gas for diluting the precursor gas (hereinafter, referred to as a "diluent gas"). The diluent gas may be, for example, an oxygen-containing gas, a hydrogen-containing gas, or a rare gas. The hydrogen-containing gas may include hydrogen gas ($H_2$ gas) and/or hydrocarbon gas such as $CH_4$ gas. The diluent gas may be a gas that oxidizes the precursor gas or a gas that reduces the precursor gas. The mixed gas that is used in step ST1 may further include a rare gas such as argon gas.

In an embodiment, in step ST1, the power level of the first radio-frequency power and/or the power level of the second radio-frequency power is set to a relatively low power level, in order to suppress an excessive dissociation of the precursor gas. In an embodiment, in step ST1, only the second radio-frequency power of the first radio-frequency power and the second radio-frequency power is supplied, in order to generate plasma. In an embodiment, in step ST1, the pressure in chamber 10 may be set to a comparatively high pressure, in order to suppress the excessive dissociation of the precursor gas.

In another embodiment, the precursor gas may be silicon halide gas such as $SiCl_4$ gas. In this embodiment, the silicon-containing layer SCF is formed by a plasma processing using a mixed gas further including a nitrogen-containing gas and a carbon-containing gas, in addition to the precursor gas. The nitrogen-containing gas is, for example, $NH_3$ gas. The carbon-containing gas may be hydrocarbon gas such as $CH_4$ gas.

In order to perform step ST1, the controller MC controls the gas supply GS to supply the above-described precursor gas or mixed gas into the chamber 10. In order to perform step ST1, the controller MC controls the exhaust device 50 to control the pressure in the chamber 10 to a specified pressure. In order to perform step ST1, the controller MC controls the first radio-frequency power supply 62 and/or the second radio-frequency power supply 64 to supply the first radio-frequency power and/or the second radio-frequency power.

Figure 6:
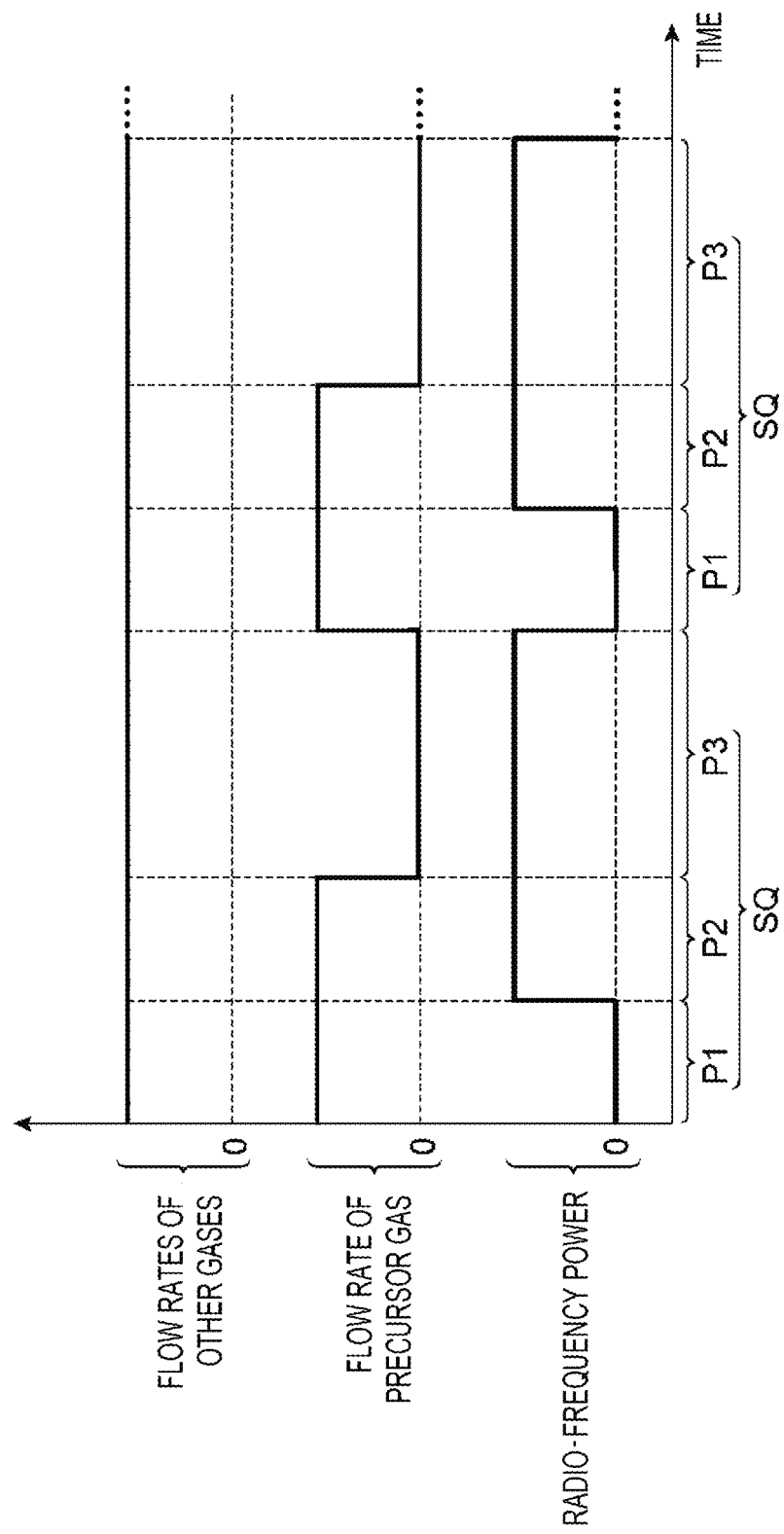
FIG. 6 is a timing chart of an example of step ST1 of the etching method illustrated in FIG. 1.

Hereinafter, FIG. 6 will be referred to. FIG. 6 is a timing chart of an example of step ST1 of the etching method illustrated in FIG. 1. In FIG. 6, the horizontal axis represents time. In FIG. 6, the vertical axis represents flow rates of other gases used in step ST1, that is, flow rates of gases other than the precursor gas in the mixed gas described above, a flow rate of the precursor gas, and the radio-frequency power. As illustrated in FIG. 6, step ST1 of an embodiment may include repeating a sequence SQ.

The sequence SQ includes supplying other gases to the substrate W. The other gases include the above-described diluent gas when the precursor gas is an aminosilane-based gas. The other gases may further include the above-described rare gas when the precursor gas is an aminosilane-based gas. The other gases include the above-described nitrogen-containing gas and carbon-containing gas when the precursor gas is a silicon halide gas. The other gases are supplied to the substrate W in a first time period P1, a second time period P2, and a third time period P3. The second time period P2 is subsequent to the first time period P1. The third time period P3 is subsequent to the second time period P2.

The sequence SQ further includes supplying the above-described precursor gas to the substrate W in the first time period P1 and the second time period P2. The sequence SQ includes supplying the first radio-frequency power and/or the second radio-frequency power in the second time period P2 and the third time period P3. In the second time period P2, plasma is formed from the mixed gas in the chamber 10. In the third time period P3, plasma is formed from the other gases in the chamber 10. By repeating the sequence SQ, it becomes possible to form the silicon-containing layer SCF on the surface of the substrate W. Further, by setting the number of times of repeating the sequence SQ, it becomes possible to adjust the film thickness of the silicon-containing layer SCF.

Meanwhile, the first radio-frequency power and the second radio-frequency power may not be supplied in the second time period P2 of the sequence SQ. That is, plasma may not be generated in the chamber 10 in the second time period P2 of the sequence SQ. In this case, the precursor gas is adsorbed to the substrate W in the second time period P2. Alternatively, plasma may be generated in the chamber 10 in the first time period P1 to the third time period P3 of the sequence SQ. By adjusting a time period of the sequence SQ during which plasma is generated, the film thickness of the silicon-containing layer SCF to be formed on the substrate W may be adjusted. Further, by adjusting the pressure of gas in the chamber 10 and/or the power level of the second radio-frequency power in the first time period P1 and/or the second time period P2, it becomes possible to adjust the place where the silicon-containing layer SCF is formed. For example, when the pressure of gas in the chamber 10 in the first time period P1 and/or the second time period P2 is set to a relatively radio-pressure, the silicon-containing layer SCF may be isotropically formed. In addition, in the first time period P1 and/or the second time period P2, the pressure of gas in the chamber 10 may be set to a relatively low pressure, and the power level of the second radio-frequency power may be set to a relatively high level. In this case, the silicon-containing layer SCF is easily preferentially formed on the upper surface of the mask MK and the bottom surface of the mask MK that defines an opening of the mask MK.

In the method MT, an etching-back of the silicon-containing layer SCF may be subsequently performed as illustrated in FIG. 4B. Specifically, the partial areas of the silicon-containing layer SCF that extend on the upper surface of the mask MK and on the surface of the silicon oxide film OSF are removed, and the other partial areas of the silicon-containing layer SCF that extend along the side wall of the mask MK are left.

The substrate W is held by the electrostatic chuck 20 during the performance of the etching-back of the silicon-containing layer SCF. In the etching-back of the silicon-containing layer SCF, plasma is generated from the processing gas in the chamber 10. The processing gas includes, for example, fluorocarbon gas such as $CF_4$ gas. The partial areas of the silicon-containing layer SCF are etched by chemical species supplied from the plasma.

For the etching-back of the silicon-containing layer SCF, the controller MC controls the gas supply GS to supply the processing gas into the chamber 10. For the etching-back of the silicon-containing layer SCF, the controller MC controls the exhaust device 50 to control the pressure in the chamber 10 to a specified pressure. The etching-back of the silicon-containing layer SCF is an anisotropic etching. Thus, for the etching-back of the silicon-containing layer SCF, the controller MC controls the first radio-frequency power supply 62 and the second radio-frequency power supply 64 to supply the first radio-frequency power and the second radio-frequency power.

In the method MT, step ST2 is subsequently performed. In step ST2, a plasma etching of the film of the substrate is performed. The substrate is held by the electrostatic chuck 20 during the performance of step ST2. In step ST2, plasma is formed from the processing gas in the chamber 10. The processing gas used in step ST2 may be any gas that is able to selectively etch the film with respect to the silicon-containing layer SCF. In step ST2, the film of the substrate is etched by chemical species supplied from the plasma.

In an example of step ST2, a plasma etching of the silicon oxide film OSF of the substrate W is performed. The substrate W is held by the electrostatic chuck 20 during the performance of step ST2. In step ST2, plasma is generated from the processing gas in the chamber 10. The processing gas includes fluorocarbon gas such as $C_4F_6$ gas. The processing gas may further include a rare gas such as oxygen gas ($O_2$ gas) or argon gas. In step ST2, the silicon oxide film OSF is etched by chemical species supplied from the plasma. As a result of the plasma etching of the silicon oxide film OSF, the pattern of the mask MK is transferred to the silicon oxide film OSF as illustrated in FIG. 5A. Meanwhile, the resist mask RM and the antireflection film ARF may also be etched during the performance of step ST2.

For performing step ST2, the controller MC controls the gas supply GS to supply the processing gas into the chamber 10. For performing step ST2, the controller MC controls the exhaust device 50 to control the pressure in the chamber 10 to a specified pressure. For performing step ST2, the controller MC controls the first radio-frequency power supply 62 and/or the second radio-frequency power supply 64 to supply the first radio-frequency power and/or the second radio-frequency power.

The method MT may further include a step of removing the mask MK. The mask MK, that is, the organic film OF is removed by a plasma processing using an oxygen-containing gas such as $O_2$ gas. As a result, the substrate W illustrated in FIG. 5B is prepared.

For the removal of the mask MK, the controller MC controls the gas supply GS to supply the oxygen-containing gas into the chamber 10. For the removal of the mask MK, the controller MC controls the exhaust device 50 to control the pressure in the chamber 10 to a specified pressure. For the removal of the mask MK, the controller MC controls the first radio-frequency power supply 62 and/or the second radio-frequency power supply 64 to supply the first radio-frequency power and/or the second radio-frequency power.

In the method MT, the silicon-containing layer SCF formed on the mask includes silicon, carbon, and nitrogen. Thus, it becomes possible to etch the film in a state where a layer different from the silicon oxide layer is formed on the mask.

In the method MT, the substrate W is placed in a depressurized environment for at least a time period from a start time point of step ST1 to an end time point of ST2. That is, in the method MT, the substrate W is not exposed to the atmosphere for at least the time period from the start time point of step ST1 to the end time point of step ST2. In other words, the substrate W is processed without breaking the vacuum in the environment where the substrate W is placed, for at least the time period from the start time point of step ST1 to the end time point of step ST2. In an embodiment, the substrate W is placed in the chamber 10 of the single plasma processing apparatus 1 for at least the time period from the start time point of step ST1 to the end time point of step ST2.

In an embodiment, the silicon-containing layer SCF formed on the mask MK does not substantially have silicon-oxygen bonds in the skeleton thereof. Further, the etching of the silicon oxide film OSF is performed without causing the silicon-containing layer SCF to be exposed to the atmosphere. Accordingly, the silicon-containing layer SCF is suppressed from being oxidized. Thus, the silicon-containing layer SCF is suppressed from being etched during the plasma etching of the silicon oxide film OSF.

In step ST1 of an embodiment, the temperature of the substrate W may be set to 150° C. or lower. When step ST2 is performed, the temperature of the substrate W may be set to be lower than the temperature of the substrate W when step ST1 is performed. The temperature of the substrate when a general silicon-containing layer is formed is set to a considerably high temperature such as 400° C. However, in the present embodiment, the temperature of the substrate W when the silicon-containing layer SCF is formed is relatively low. Thus, according to the present embodiment, it becomes possible to reduce a difference between the temperature of the substrate W when the silicon-containing layer SCF is formed and the temperature of the substrate W when the film (the silicon oxide film OSF in an example) is etched. Accordingly, the time for the shift from step ST1 to step ST2 may be reduced.

Figure 7:
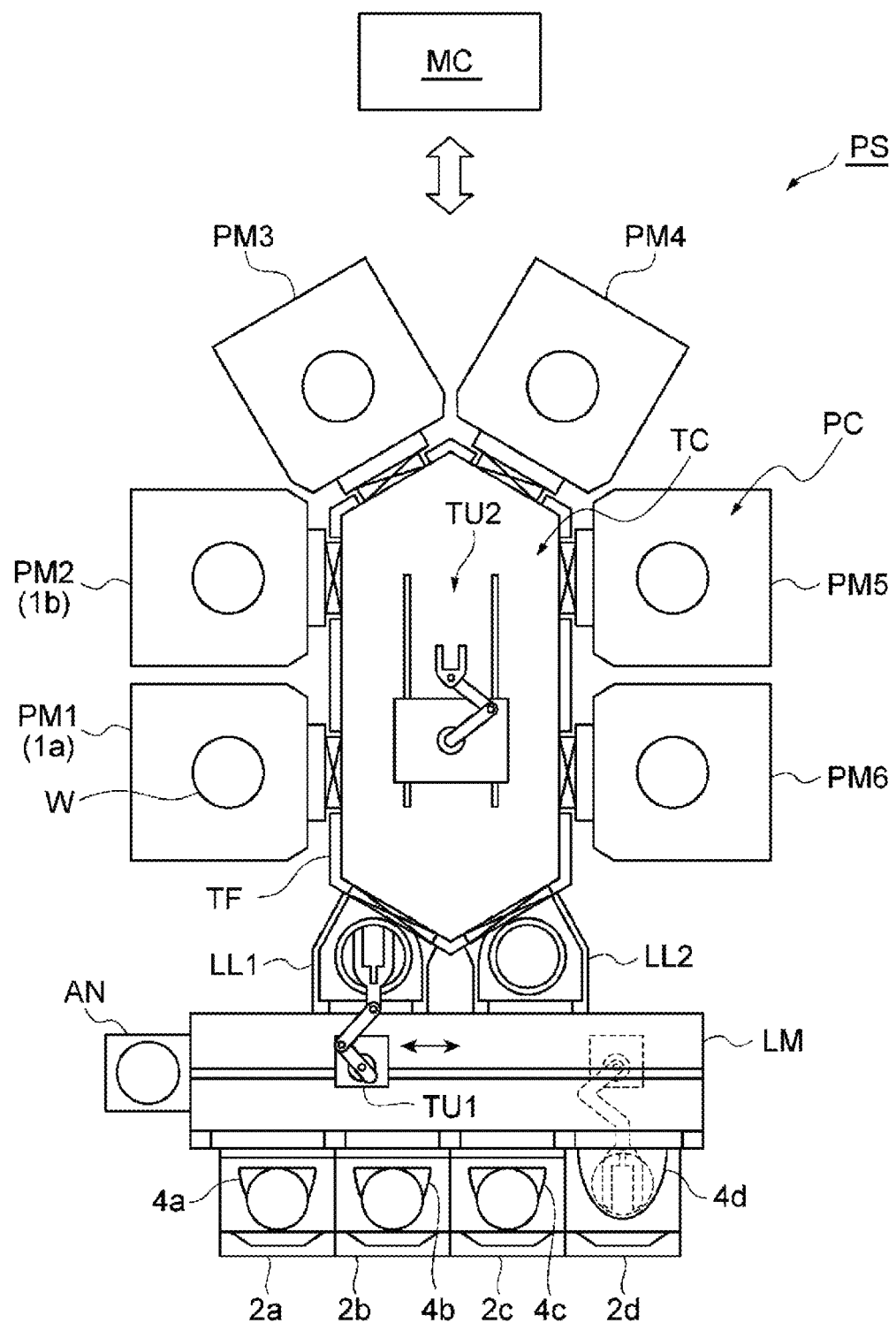
FIG. 7 is a view schematically illustrating an example of a processing system which is usable for performing the etching method illustrated in FIG. 1.

Hereinafter, FIG. 7 will be referred to. FIG. 7 is a view schematically illustrating an example of a processing system which is usable for performing the etching method illustrated in FIG. 1. As long as the substrate W is placed in a depressurized environment for at least the time period from the start time point of step ST1 to the end time point of step ST2, steps ST1 and ST2 may be performed using different plasma processing apparatuses. The processing system illustrated in FIG. 7 may be used for performing the method MT in this case.

A processing system PS illustrated in FIG. 7 includes tables 2a to 2d, containers 4a to 4d, a loader module LM, an aligner AN, load lock modules LL1 and LL2, process modules PM1 to PM6, a transfer module TF, and a controller MC. Meanwhile, each of the number of tables, the number of containers, and the number of load lock modules in the processing system PS may be an arbitrary number of two or more. Further, the number of process modules may be an arbitrary number of two or more.

The tables 2a to 2d are arranged along one edge of the loader module LM. The containers 4a to 4d are mounted on the tables 2a to 2d, respectively. Each of the containers 4a to 4d is called, for example, FOUP (front opening unified pod). Each of the containers 4a to 4d is configured to accommodate the substrate W therein.

The loader module LM includes a chamber. The pressure in the chamber of the loader module LM is set to the atmospheric pressure. A transfer device TU1 is provided in the chamber of the loader module LM. The transfer device TU1 is, for example, an articulated robot and is controlled by the controller MC. The transfer device TU1 is configured to transfer the substrate W between each of the containers 4a to 4d and the aligner AN, between the aligner AN and each of the load lock modules LL1 to LL2, and between each of the load lock modules LL1 to LL2 and each of the containers 4a to 4d. The aligner AN is connected to the loader module LM. The aligner AN is configured to adjust the position of the substrate W (position calibration).

Each of the load lock modules LL1 and LL2 is provided between the loader module LM and the transfer module TF. Each of the load lock modules LL1 and LL2 provides a preliminary decompression chamber.

The transfer module TF is connected to the load lock modules LL1 and LL2 via gate valves. The transfer module TF includes a transfer chamber TC that may be depressurized. A transfer device TU2 is provided in the transfer chamber TC. The transfer device TU2 is, for example, an articulated robot and is controlled by the controller MC. The transfer device TU2 is configured to transfer the substrate W between each of the load lock modules LL1 to LL2 and each of the process modules PM1 to PM6 and between any two process modules of the process modules PM1 to PM6.

Each of the process modules PM1 to PM6 is a processing apparatus configured to perform a dedicated substrate processing. One process module of the process modules PM1 to PM6 is a first plasma processing apparatus 1a. Another process module of the process modules PM1 to PM6 is a second plasma processing apparatus 1b. In the example illustrated in FIG. 7, the process module PM1 is the first plasma processing apparatus 1a, and the process module PM2 is the second plasma processing apparatus 1b. In an embodiment, each of the first plasma processing apparatus 1a and the second plasma processing apparatus 1b may be the same as the plasma processing apparatus 1.

The above-described transfer module TF constitutes a vacuum transfer system. The transfer module TF is configured to transfer the substrate between the first plasma processing apparatus 1a and the second plasma processing apparatus 1b.

In the processing system PS, the controller MC is configured to control each unit of the processing system PS, for example, the first plasma processing apparatus 1a, the second plasma processing apparatus 1b, and the transfer module TF.

The control of each unit of the first plasma processing apparatus 1a by the controller MC for performing step ST1 is the same as the above-described control of each unit of the plasma processing apparatus 1 by the controller MC for performing step ST1. Specifically, for performing step ST1, the controller MC controls the gas supply GS of the first plasma processing apparatus 1a to supply the above-described precursor gas or mixed gas into the chamber 10 of the first plasma processing apparatus 1a. Further, for performing step ST1, the controller MC controls the exhaust device 50 of the first plasma processing apparatus 1a to control the pressure in the chamber 10 of the first plasma processing apparatus 1a to a specified pressure. Further, for performing step ST1, the controller MC controls the first radio-frequency power supply 62 and/or the second radio-frequency power supply 64 of the first plasma processing apparatus 1a to supply the first radio-frequency power and/or the second radio-frequency power.

After step ST1 is performed and before step ST2 is performed, the controller MC transfers the substrate W from the internal space 10s of the chamber 10 of the first plasma processing apparatus 1a to the internal space 10s of the chamber 10 of the second plasma processing apparatus 1b via the depressurized chamber of the transfer module TF. For this transfer, the controller MC controls the transfer module TF. When the processing system PS is used in the method MT, the substrate W is not also exposed to the atmosphere for at least the time period from the start time point of step ST1 to the end time point of step ST2. In other words, the substrate W is processed without breaking the vacuum in the environment where the substrate W is placed, for at least the time period from the start time point of step ST1 to the end time point of step ST2.

The control of each unit of the second plasma processing apparatus 1b by the controller MC for performing step ST2 is the same as the above-described control of each unit of the plasma processing apparatus 1 by the controller MC for performing step ST2. Specifically, for performing step ST2, the controller MC controls the gas supply GS of the second plasma processing apparatus 1b to supply the processing gas into the chamber 10 of the second plasma processing apparatus 1b. Further, for performing step ST2, the controller MC controls the exhaust device 50 of the second plasma processing apparatus 1b to control the pressure in the chamber 10 of the second plasma processing apparatus 1b to a specified pressure. Further, for performing step ST2, the controller MC controls the first radio-frequency power supply 62 and the second radio-frequency power supply 64 of the second plasma processing apparatus 1b to supply the first radio-frequency power and the second radio-frequency power.

Meanwhile, for the plasma etching of the antireflection film ARF, each unit of one of the first plasma processing apparatus 1a and the second plasma processing apparatus 1b may be controlled in the same manner as that for each unit of the plasma processing apparatus 1. In addition, for the plasma etching of the organic film OF, each unit of one of the first plasma processing apparatus 1a and the second plasma processing apparatus 1b may be controlled in the same manner as that for each unit of the plasma processing apparatus 1. In addition, for the etching-back of the silicon-containing layer SCF, each unit of one of the first plasma processing apparatus 1a and the second plasma processing apparatus 1b may be controlled in the same manner as that for each unit of the plasma processing apparatus 1. In addition, for the removal of the mask MK, each unit of one of the first plasma processing apparatus 1a and the second plasma processing apparatus 1b may be controlled in the same manner as that for each unit of the plasma processing apparatus 1. The plasma etching of the antireflection film ARF and the plasma etching of the organic film OF may be performed using plasma processing apparatuses different from the first plasma processing apparatus 1a and the second plasma processing apparatus 1b. In addition, the etching-back of the silicon-containing layer SCF and the plasma etching of the antireflection film ARF may be performed using plasma processing apparatuses different from the first plasma processing apparatus 1a and the second plasma processing apparatus 1b.

While various embodiments have been described, the present disclosure is not limited to the embodiments, and various omissions, substitutions, and modifications may be made. In addition, components in the different embodiments may be combined with each other to form other embodiments.

For example, each of the single or multiple plasma processing apparatuses used in performing the method MT may be any type of plasma processing apparatus. Such a plasma processing apparatus may be an inductively coupled plasma processing apparatus or a plasma processing apparatus that uses surface waves such as microwaves for generating plasma. In addition, the first plasma processing apparatus 1a and the second plasma processing apparatus 1b may be different types of plasma processing apparatuses.

Hereinafter, descriptions will be made on experiments conducted for evaluating the method MT. In the experiment, a sample was prepared which has a line and space pattern formed of a silicon oxide film on a silicon film. The diameter of the sample was 300 mm. Then, steps ST1 and ST2 were applied to the sample using the processing system PS. In the experiment, step ST1 was performed using the first plasma processing apparatus 1a, and step ST2 was performed using the second plasma processing apparatus 1b. In the experiment, the sample was not exposed to the atmosphere for the time period from the start time point of step ST1 to the end time point of step ST2. That is, in the experiment, when step ST1 shifts to step ST2, the sample was transferred from the first plasma processing apparatus 1a to the second plasma processing apparatus 1b only through the space in the depressurized chamber of the transfer module TF.

Further, a comparative experiment was conducted for comparison. In the comparative experiment, the same sample as described above was prepared, and after step ST1 was applied to the sample using the first plasma processing apparatus 1a, the sample was exposed to the atmosphere, and then, step ST2 was applied to the sample using the second plasma processing apparatus 1b.

Below are the conditions for steps ST1 and ST2 in each of the experiment and the comparative experiment.

<Conditions for Step ST1>
Aminosilane-based gas: 20 sccm
$H_2$ gas: 400 sccm
Argon gas: 800 sccm
Pressure in chamber 10: 700 mTorr (93.33 Pa)
First radio-frequency power: 0 W
Second radio-frequency power: 40 MHz, 30 W
Temperature of sample: 120° C.
<Conditions for Step ST2>
$C_4F_6$ gas: 2.7 sccm
$O_2$ gas: 2.5 sccm
Argon gas: 1,000 sccm
Pressure in chamber 10: 30 mTorr (4 Pa)
First radio-frequency power: 40 MHz, 350 W
Second radio-frequency power: 13 MHz, 0 W
Temperature of sample: 60° C.

Figures 8A, 8B, 8C:
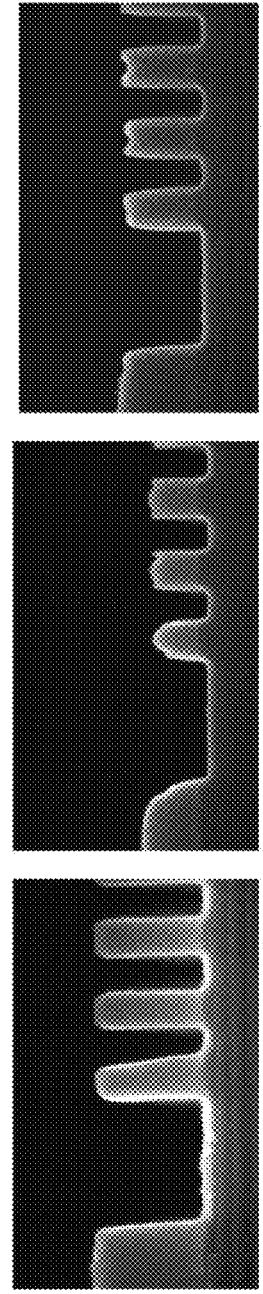
FIG. 8A is an image of a processed sample.
FIG. 8B is an image of a sample after step ST2 of a comparative experiment is applied.
FIG. 8C is an image of a sample after step ST2 of an experiment is applied.

In the experiment and the comparative experiment, images (SEM image) of the sample after the performance of step ST2 were acquired. FIG. 8A is an image of the unprocessed sample, FIG. 8B is an image of the sample after step ST2 of the comparative experiment was applied, and FIG. 8C is an image of the sample after step ST2 of the experiment was applied. As apparent from the comparison between FIGS. 8A and 8B, in the comparative experiment, the film thickness of the line of the silicon oxide film was largely reduced by the performance of step ST2. This is because the sample was exposed to the atmosphere after the performance of step ST1 and before the performance of step ST2, and thus, the silicon-containing layer formed in step ST1 was oxidized. Meanwhile, as apparent from the comparison between FIGS. 8A and 8C, the film thickness of the line of the silicon oxide film was hardly reduced in the experiment. This is because the silicon-containing layer formed in step ST1 was not oxidized before the performance of step ST2, and the line of the silicon oxide film was protected during the performance of step ST2.

In addition, in another experiment, a silicon-containing layer was formed on a wafer made of silicon oxide using the plasma processing apparatus 1. The silicon-containing layer is an example of the film formed in step ST1 of the above-described method MT. Below are the conditions for forming the silicon-containing layer.

<Conditions for Forming Silicon-Containing Layer>
Aminosilane-based gas: 100 sccm
$H_2$ gas: 400 sccm
Argon gas: 500 sccm
Pressure in chamber 10: 500 mTorr (87.5 Pa)
First radio-frequency power: 60 MHz, 300 W
Second radio-frequency power: 0 W
Wafer temperature: 80° C.

Figure 9:
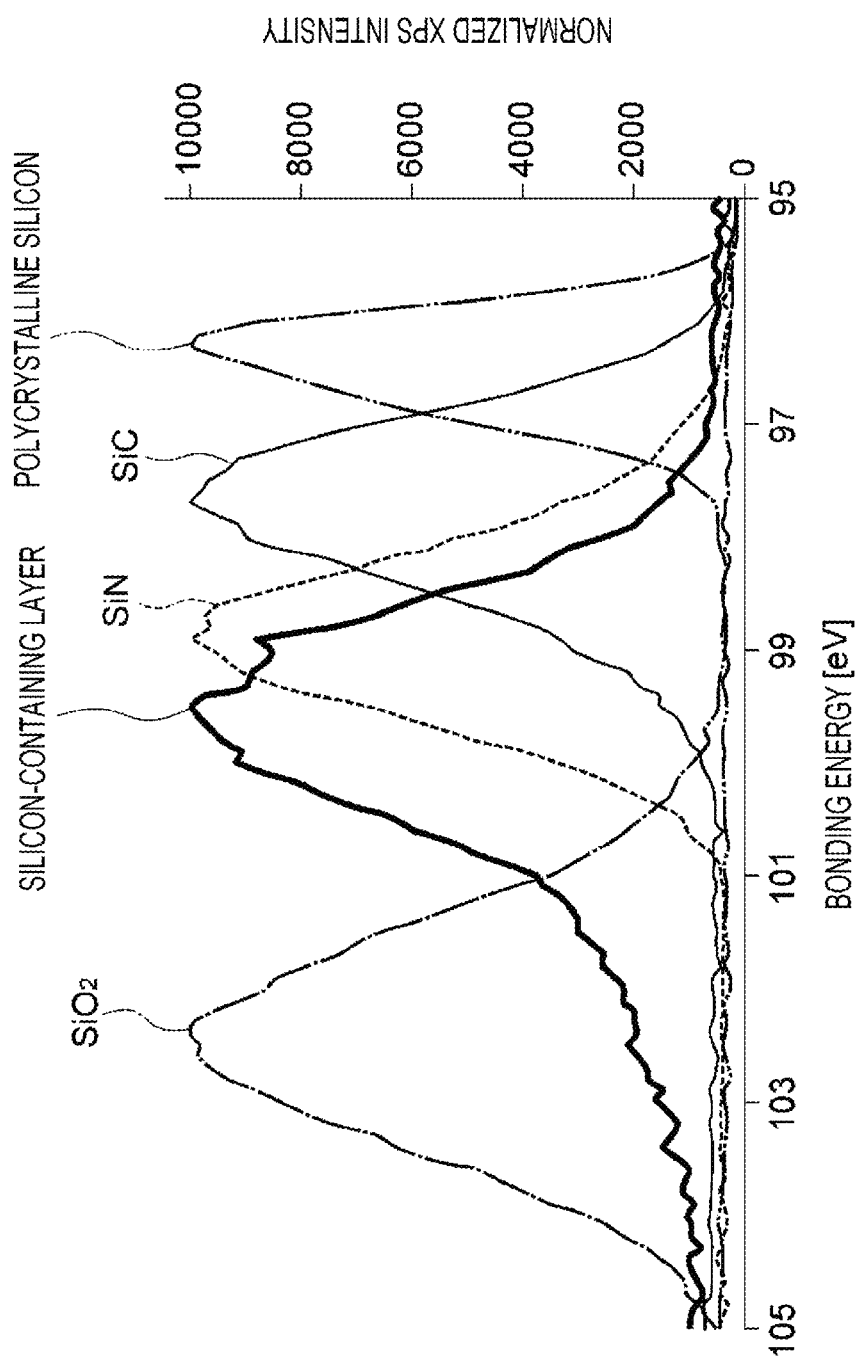
FIG. 9 is a view illustrating a Si-2p spectrum of a silicon-containing layer prepared in another experiment according to X-ray photoelectron spectroscopy.

Then, an Si-2p spectrum of the formed silicon-containing layer was acquired using an X-ray photoelectron spectroscopy in the atmosphere. FIG. 9 is a view illustrating the Si-2p spectrum of the silicon-containing layer prepared in another experiment by the X-ray photoelectron spectroscopy. Further, FIG. 9 illustrates an Si-2p spectrum of each of silicon oxide ($SiO_2$), silicon nitride (SiN), silicon carbide (SiC), and polycrystalline silicon, in addition to the Si-2p spectrum of the silicon-containing layer. As illustrated in FIG. 9, the prepared silicon-containing layer had a spectrum between the spectrum of silicon oxide and the spectrum of silicon nitride. Further, the prepared silicon-containing layer had a spectrum different from the spectrum of each of silicon oxide, silicon nitride, silicon carbide, and polycrystalline silicon. Thus, it was confirmed that a silicon-containing layer may be formed of a material different from silicon oxide, silicon nitride, silicon carbide, and polycrystalline silicon under the above-described formation conditions.

According to an embodiment, it becomes possible to etch the film in a state where a layer different from the silicon oxide layer is formed on the mask.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A method of etching comprising:
providing a substrate having a film and a patterned mask on the film;
forming a silicon-containing layer including silicon, carbon, and nitrogen on the substrate using a precursor gas containing silicon, a material of the silicon-containing layer being different from the film; and performing a plasma etching on the film, wherein the forming of the silicon-containing layer is performed prior to commencement of the performing of the plasma etching on the film, wherein the substrate is placed under a depressurized environment for a time period from a start time point of the forming the silicon-containing layer on the substrate to an end time point of the performing the plasma etching on the film, wherein the film is a silicon oxide film, and the silicon containing layer is an SiCN layer, and wherein in forming the SiCN layer, the SiCN layer is formed on a side wall of an opening of the mask to reduce a width of the opening of the mask, and wherein prior to forming the SiCN layer, a surface of the silicon oxide film is exposed through the opening of the mask, and during forming of the SiCN layer, the SiCN layer is formed on the surface of the silicon oxide film exposed through the mask, the method further comprising, after forming of the SiCN layer, performing an etch back of the SiCN layer to remove the SiCN layer from the silicon oxide film while retaining the SiCN layer on the side wall of the opening of the mask, and after the etch back of the SiCN layer, the silicon oxide film is etched through the opening of the mask with the SiCN layer on the side wall of the opening of the mask.

2. The method according to claim 1, wherein the precursor gas is an aminosilane-based gas.

3. The method according to claim 2, wherein in the forming the silicon-containing layer, a plasma processing is performed using a mixed gas including the precursor gas and a diluent gas that dilutes the precursor gas.

4. The method according to claim 2, wherein the forming the silicon-containing layer includes repeating a sequence including:
supplying the diluent gas to the substrate in a first time period, a second time period subsequent to the first time period, and a third time period subsequent to the second time period;
supplying the precursor gas to the substrate in the first time period and the second time period; and
supplying a radio-frequency power in the second time period and the third time period, in order to form plasma from the precursor gas and the diluent gas in the second time period and generate plasma from the diluent gas in the third time period, and wherein the supplying of the radio-frequency power commences in the second time period but is not performed during the first time period.

5. The method according to claim 4, wherein the forming the silicon-containing layer and the performing the plasma etching are performed using a single plasma processing apparatus, and
the substrate is placed in a chamber of the single plasma processing apparatus, for a time period from a start time point of the forming the silicon-containing layer to an end time point of the performing the plasma etching.

6. The method according to claim 4, wherein the forming the silicon-containing layer and the performing the plasma etching are performed using separate processing apparatuses including a first plasma processing apparatus and a second plasma processing apparatus connected to the first plasma processing apparatus via a vacuum transfer system, respectively,
the substrate is disposed in the processing chamber of the first plasma processing apparatus during the forming the silicon-containing layer,
the substrate is transferred from the first plasma processing apparatus to the second plasma processing apparatus exclusively through the vacuum transfer system, after the forming the silicon-containing layer and before the performing the plasma etching of the film, and
the substrate is disposed in the processing chamber of the second plasma processing apparatus during the performing the plasma etching on the film.

7. The method according to claim 6, wherein in the forming the SiCN layer, a temperature of the substrate is set to 150° C. or lower, and
wherein the silicon-containing layer has no silicon-oxygen bond.

8. The method according to claim 1, wherein the forming the silicon-containing layer includes repeating a sequence including:
supplying the diluent gas to the substrate in a first time period, a second time period subsequent to the first time period, and a third time period subsequent to the second time period;
supplying the precursor gas to the substrate in the first time period and the second time period; and
supplying a radio-frequency power in the second time period and the third time period, in order to form plasma from the precursor gas and the diluent gas in the second time period and generate plasma from the diluent gas in the third time period.

9. The method according to claim 1, wherein the forming the silicon-containing layer and the performing the plasma etching are performed using a single plasma processing chamber of a single plasma processing apparatus, and
the substrate is placed in the single plasma processing chamber of the single plasma processing apparatus, for a time period from a start time point of the forming the silicon-containing layer to an end time point of the performing the plasma etching.

10. The method according to claim 1, wherein the forming the silicon-containing layer and the performing the plasma etching are performed using separate processing apparatuses including a first plasma processing apparatus and a second plasma processing apparatus connected to the first plasma processing apparatus via a vacuum transfer system, respectively,
the substrate is disposed in the processing chamber of the first plasma processing apparatus during the forming the silicon-containing layer,
the substrate is transferred from the first plasma processing apparatus to the second plasma processing apparatus exclusively through the vacuum transfer system, after the forming the silicon-containing layer and before the performing the plasma etching of the film, and
the substrate is disposed in the processing chamber of the second plasma processing apparatus during the performing the plasma etching on the film.

11. The method according to claim 1, wherein in the forming the silicon-containing layer, a temperature of the substrate is set to 150° C. or lower.

12. The method according to claim 1, wherein the silicon-containing layer has no silicon-oxygen bond.

13. A method of etching comprising:
providing a substrate having a film and a patterned mask on the film, the patterned mask including an opening through which a surface of the film is exposed at the bottom of the opening;
forming an SiCN layer on the substrate using a precursor gas containing silicon, a material of the SiCN layer being different from the film, and wherein the SiCN is formed on a side wall of the opening and on the surface of the film exposed at the bottom of the opening; and
performing a plasma etching on the film, wherein the forming of the SiCN layer is performed prior to the commencement of the performing of the plasma etching of the film,
wherein the substrate is placed under a depressurized environment for a time period from a start time point of the forming the silicon-containing layer on the substrate to an end time point of the performing the plasma etching on the film,
the precursor gas is an aminosilane-based gas,
the forming the silicon-containing layer includes repeating a sequence including:
supplying the diluent gas to the substrate in a first time period, a second time period subsequent to the first time period, and a third time period subsequent to the second time period;
supplying the precursor gas to the substrate in the first time period and the second time period; and
supplying a radio-frequency power in the second time period and the third time period, in order to form plasma from the precursor gas and the diluent gas in the second time period and generate plasma from the diluent gas in the third time period,
the forming the silicon-containing layer and the performing the plasma etching are performed using a single chamber of a single plasma processing apparatus,
the substrate is placed in the single chamber of the single plasma processing apparatus, for a time period from a start time point of the forming the silicon-containing layer to an end time point of the performing the plasma etching,
the silicon-containing layer has no silicon-oxygen bond, and
the film is a silicon oxide film.

14. A method of etching comprising:
providing a substrate having a film and a patterned mask on the film;
forming a silicon-containing layer including silicon, carbon, and nitrogen on the substrate using a precursor gas containing silicon, a material of the silicon-containing layer being different from the film; and
performing a plasma etching on the film, wherein the forming of the silicon-containing layer is performed prior to commencement of the performing of the plasma etching on the film,
wherein the substrate is placed under a depressurized environment for a time period from a start time point of the forming the silicon-containing layer on the substrate to an end time point of the performing the plasma etching on the film,
wherein the silicon-containing layer is an SiCN layer, and during forming of the SiCN layer, the SiCN layer is formed on a side wall of an opening of the mask through which the film is exposed, and
wherein during etching of the film, portions of the mask are etched while the SiCN layer previously formed on the side wall of the mask remains to provide an opening through which the film is etched.

15. A method of etching comprising:
providing a substrate having a film and a patterned mask on the film;
forming a silicon-containing layer including silicon, carbon, and nitrogen on the substrate using a precursor gas containing silicon, a material of the silicon-containing layer being different from the film; and
performing a plasma etching on the film, wherein the forming of the silicon-containing layer is performed prior to commencement of the performing of the plasma etching on the film,
wherein the substrate is placed under a depressurized environment for a time period from a start time point of the forming the silicon-containing layer on the substrate to an end time point of the performing the plasma etching on the film,
wherein the silicon-containing layer is an SiCN layer, and during forming of the SiCN layer, the SiCN layer is formed on a side wall of an opening of the mask and a surface of the film exposed through the mask,
wherein the film comprises silicon oxide, and
wherein the mask includes an organic layer, an antireflection film formed above the organic layer, and a resist mask formed above the antireflection film.

16. The method of claim 15, wherein the etch back of the SiCN layer and the etching of the film are performed with different process gases.

17. A method of etching, comprising:
providing a substrate having a film and a patterned mask on the film, the patterned mask including an opening through which a surface of the film is exposed, the opening further including a side wall;
forming an SiCN layer on the side wall of opening to reduce a width of the opening and provide a reduced width opening, and wherein during forming of the SiCN layer, the SiCN layer is also formed on the surface of the film exposed through the opening, wherein a material of the film is different from the SiCN layer;
performing an etch back of the SiCN layer to remove portions of the SiCN layer from the surface of the film while retaining portions of the SiCN layer on the side wall of the opening of the mask providing the reduced width opening; and
after the performing the etch back of the SiCN layer, etching the film through the reduced width opening of the mask with the SiCN layer on the side wall of the opening of the mask.

18. The method of claim 17, wherein during etching of the film, portions of the mask surrounding the SiCN layer are etched while the SiCN layer previously formed on the side wall of the mask remain to provide the reduced width opening.

19. The method of claim 18, wherein the film is a silicon oxide, and the wherein the mask includes an organic film, an antireflection film above the organic film, and a resist mask above the organic film,
during forming of the SiCN film a temperature of the substrate is set to 150° C. or lower, and
a gas used to etch back the SiCN is different than a gas used to etch the silicon oxide film.

20. The method of claim 19, wherein a $CF_4$ gas is used to etch back the SiCN layer, and a $C_4F_6$ gas is used to etch the silicon oxide film.

* * * * *